(12) United States Patent
Yamamoto

(10) Patent No.: US 9,918,387 B2
(45) Date of Patent: Mar. 13, 2018

(54) ELECTRONIC UNIT

(71) Applicant: DENSO CORPORATION, Kariya, Aichi-pref. (JP)

(72) Inventor: Toshihisa Yamamoto, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 16 days.

(21) Appl. No.: 15/090,195

(22) Filed: Apr. 4, 2016

(65) Prior Publication Data

US 2016/0295681 A1 Oct. 6, 2016

(30) Foreign Application Priority Data

Apr. 6, 2015 (JP) .................................. 2015-77791

(51) Int. Cl.
*H05K 1/02* (2006.01)
*H05K 3/00* (2006.01)
(Continued)

(52) U.S. Cl.
CPC ......... *H05K 3/0061* (2013.01); *B62D 5/0406* (2013.01); *B62D 5/0496* (2013.01); *H02K 11/25* (2016.01); *H02K 11/33* (2016.01); *H05K 1/0204* (2013.01); *H05K 1/0201* (2013.01); *H05K 1/0207* (2013.01); *H05K 2201/062* (2013.01);
(Continued)

(58) Field of Classification Search
CPC .. H05K 3/0061; H05K 1/0204; H05K 1/0207; H05K 1/0201; H05K 2201/062; H05K 2201/10151; H05K 2201/10166; H05K 2201/10409; H02K 11/25; H02K 11/33; B62D 5/0406; B62D 5/0496; G01K 1/16
See application file for complete search history.

(56) References Cited

U.S. PATENT DOCUMENTS 6,058,012 A * 5/2000 Cooper ................... G06F 1/203
165/80.3
7,019,395 B2 * 3/2006 Hirano ................ H01L 23/4338
257/707
(Continued)

FOREIGN PATENT DOCUMENTS

JP 2007-263636 A 10/2007

*Primary Examiner* — Robert J Hoffberg
*Assistant Examiner* — Matt Dhillon
(74) *Attorney, Agent, or Firm* — Knobbe, Martens, Olson & Bear, LLP

(57) ABSTRACT

An electronic unit includes a heat sink, a substrate, a heating component, a temperature sensor, a first interconnection, and a second interconnection. The heat sink includes a strut. The substrate is fixed to the strut of the heat sink. The heating component is mounted on the substrate to generate heat upon energization of the heating component. The temperature sensor is mounted on the substrate to detect temperature. The first interconnection is provided in a high-temperature region in which the heating component is mounted on the substrate, and is connected to the strut of the heat sink. The second interconnection is provided in a detection region in which the temperature sensor is mounted on the substrate, and is provided separately from the first interconnection. The second interconnection is connected to the strut of the heat sink and the temperature sensor.

7 Claims, 7 Drawing Sheets

(51) Int. Cl.
  *B62D 5/04* (2006.01)
  *H02K 11/25* (2016.01)
  *H02K 11/33* (2016.01)

(52) U.S. Cl.
  CPC .............. *H05K 2201/10151* (2013.01); *H05K 2201/10166* (2013.01); *H05K 2201/10409* (2013.01)

(56) References Cited

U.S. PATENT DOCUMENTS

| | | | | |
|---|---|---|---|---|
| 7,253,546 | B2* | 8/2007 | Fukuda | H02K 3/28 310/179 |
| 7,358,699 | B2* | 4/2008 | Kikuchi | H02K 5/22 310/113 |
| 7,989,997 | B2* | 8/2011 | Hashimoto | B62D 5/0406 310/68 D |
| 8,292,482 | B2* | 10/2012 | Harbers | F21K 9/00 362/373 |
| 8,646,568 | B2* | 2/2014 | Yamasaki | B62D 5/0406 180/400 |
| 8,895,863 | B2* | 11/2014 | Inaba | H05K 1/0201 174/252 |
| 8,985,266 | B2* | 3/2015 | Sato | B62D 7/1581 180/444 |
| 9,099,901 | B2* | 8/2015 | Fujimoto | B62D 5/0406 |
| 9,320,178 | B2* | 4/2016 | Oota | H05K 7/20854 |
| 2012/0320582 | A1* | 12/2012 | Hilscher | H01J 61/56 362/235 |
| 2014/0225482 | A1* | 8/2014 | Hara | H02K 5/22 310/68 D |

* cited by examiner

ELECTRONIC UNIT

CROSS REFERENCE TO RELATED APPLICATION

This application is based on Japanese Patent Application No. 2015-77791 filed on Apr. 6, 2015, the disclosure of which is incorporated herein by reference.

TECHNICAL FIELD

The present disclosure relates to an electronic unit.

BACKGROUND

There has been known an electronic unit in which various electronic components are mounted on a substrate, the electronic components including a heating component that generates heat due to current supply, a temperature sensor that detects temperature, and a microcomputer. The microcomputer controls current supply such that temperature of the heating component is within an allowable temperature range, based on temperature detected by the temperature sensor and a value of integral of a current supplied to the heating component. In an electronic unit of JP2007-263636A, a notch groove is provided in a substrate portion around a temperature sensor mounted on the substrate to suppress transfer of heat generated by the heating component to the temperature sensor.

However, the substrate of the electronic unit of JP2007-263636A has the notch groove while still having a portion for an interconnection to be connected to the temperature sensor. Hence, if the interconnection connected to the temperature sensor continuously extends to a region in which a heating component is mounted, heat generated by the heating component may be directly transferred to the temperature sensor through the interconnection.

For the electronic unit of JP2007-263636A, the notch groove provided around the temperature sensor causes a large substrate size. Hence, when the electronic unit is reduced in size, the notch groove is apprehensively difficult to be provided in the substrate. Furthermore, for the electronic unit of JP2007-263636A, the notch groove provided around the temperature sensor degrades stiffness of the substrate. Hence, if the electronic unit is used in an environment that transmits oscillation and the like, the substrate may be cracked from the notch groove.

SUMMARY

The present disclosure addresses at least one of the above issues. Thus, it is an objective of the present disclosure to provide an electronic unit that allows stable temperature detection.

To achieve the objective of the present disclosure, there is provided an electronic unit including a heat sink, a substrate, a heating component, a temperature sensor, a first interconnection, and a second interconnection. The heat sink includes a strut. The substrate is fixed to the strut of the heat sink. The heating component is mounted on the substrate to generate heat upon energization of the heating component. The temperature sensor is mounted on the substrate to detect temperature. The first interconnection is provided in a high-temperature region in which the heating component is mounted on the substrate, and is connected to the strut of the heat sink. The second interconnection is provided in a detection region in which the temperature sensor is mounted on the substrate, and is provided separately from the first interconnection. The second interconnection is connected to the strut of the heat sink and the temperature sensor.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereinafter, electronic control units according to some embodiments are described with reference to the accompanying drawings. When substantially the same configuration is depicted in a plurality of portions in one drawing, only some of the portions are designated by a numeral. In the some embodiments, substantially the same configuration is designated by the same numeral, and duplicated description is omitted.

First Embodiment

Figure 1:
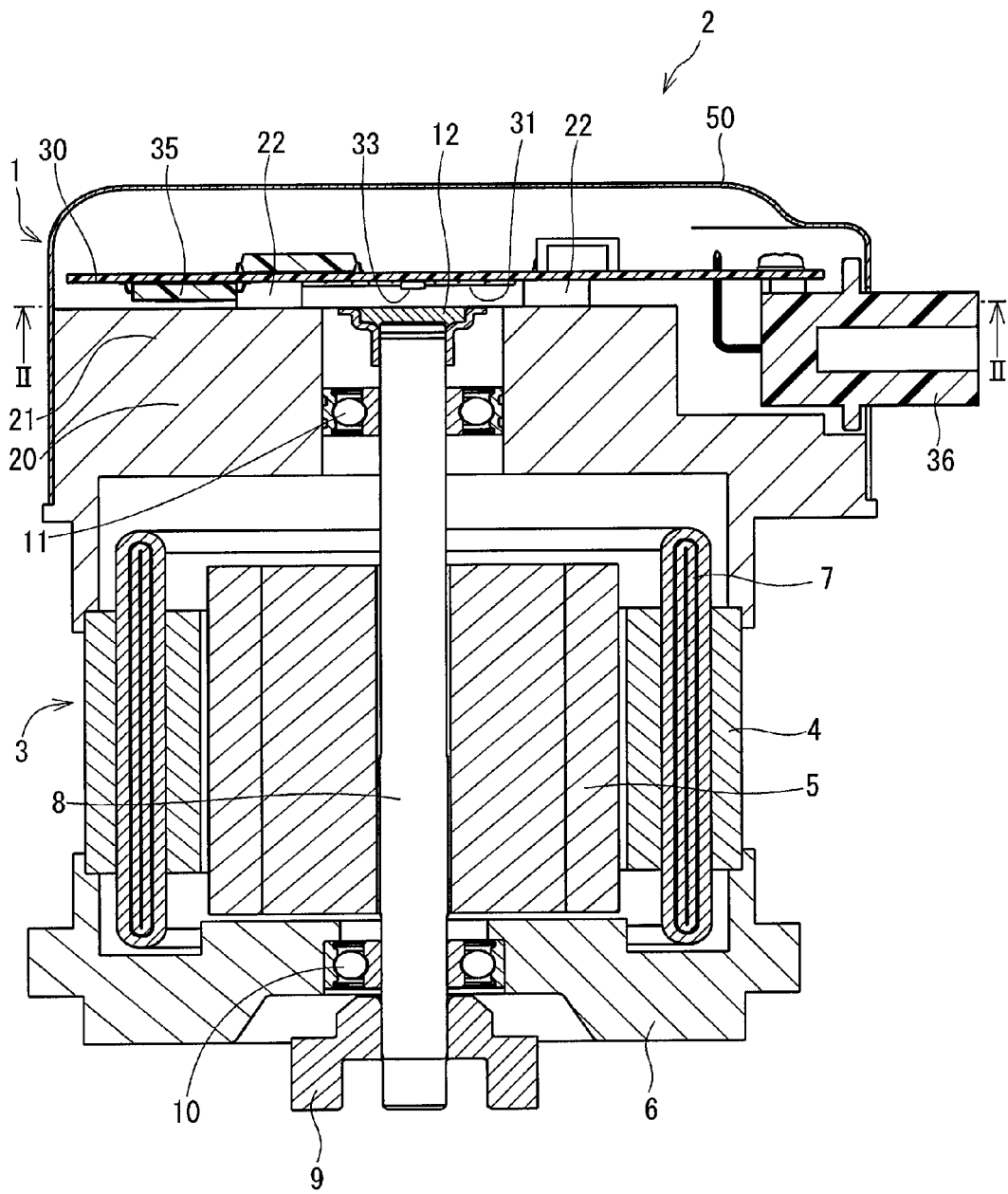
FIG. 1 is a sectional view of a driving gear of an electromotive power steering system employing an electronic unit according to a first embodiment.

A first embodiment is shown in FIGS. 1 to 5. An electronic unit 1 of the first embodiment is used in a driving gear 2 generating steering assist torque for an electromotive power steering system of a vehicle. As illustrated in FIG. 1, the driving gear 2 includes a motor part 3 and the electronic unit 1 that controls operation of the motor part 3. A configuration of the motor part 3, a configuration of the electronic unit 1, and a distinctive configuration of the electronic unit 1 are now described in this order.

Configuration of the motor part 3 will be described below. The motor part 3 includes a stator 4 and a rotor 5. The stator 4 is formed in a cylindrical shape, and has one axial end fixed to a frame end 6 and the other axial end fixed to a heat sink 20. A coil 7 is wound in a slot of the stator 4. The rotor 5 is provided with a cylindrical shape radially inside the stator 4 in a rotatable manner with respect to the stator 4. A shaft 8 fixed to the center of the rotor 5 has one side close to an output end 9, the one side being rotatably supported by a bearing 10 provided in the frame end 6, and has the other side rotatably supported by a bearing 11 provided in the heat sink 20. For the motor part 3, when current is supplied from the electronic unit 1 to the coil 7, the stator 4 generates a rotating magnetic field, and the rotor 5 and the shaft 8 rotate about an axis.

Figure 2:
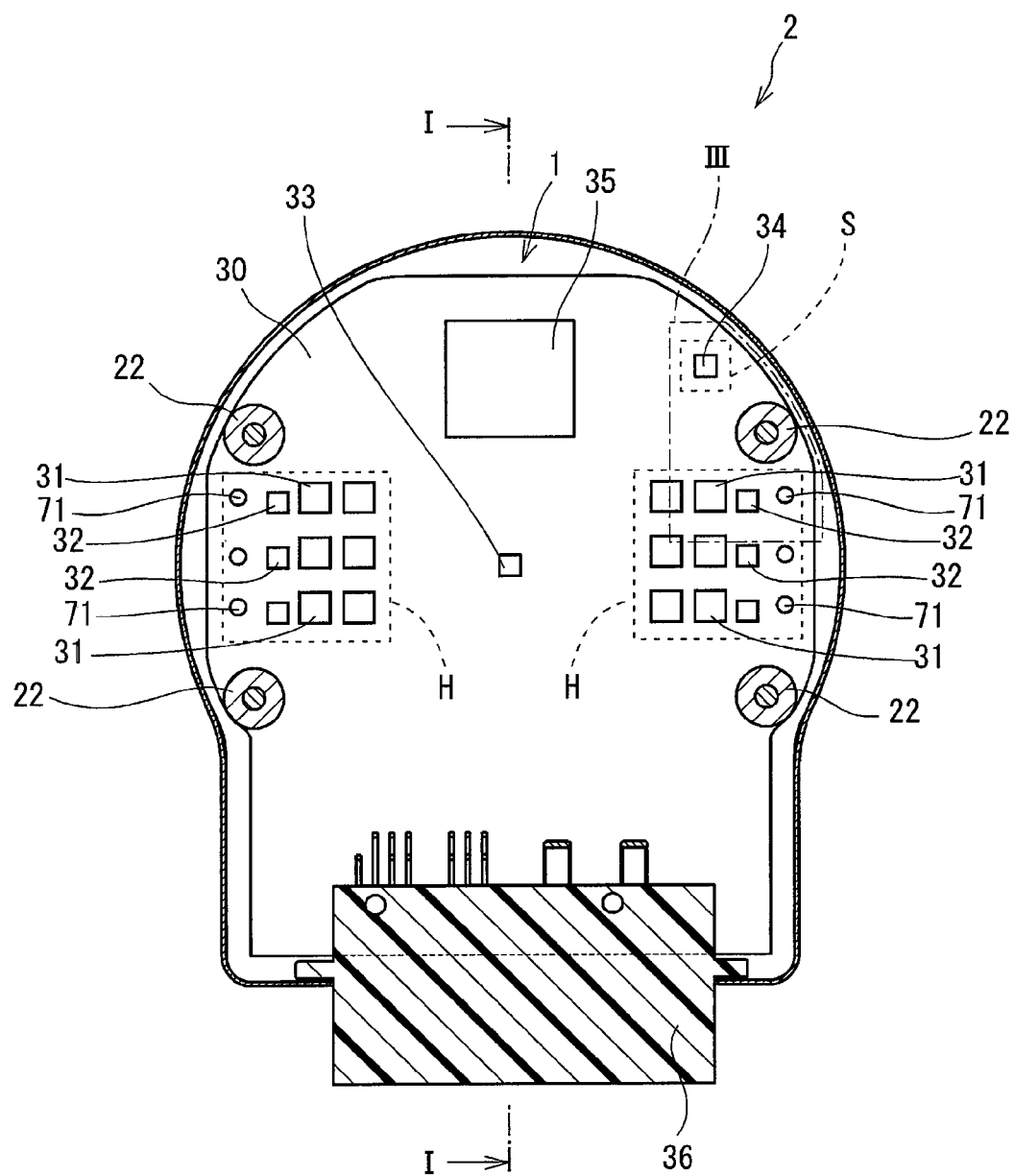
FIG. 2 is a sectional view along a line II-II of FIG. 1.

Configuration of the electronic unit 1 will be described below. As illustrated in FIGS. 1 and 2, the electronic unit 1 includes the heat sink 20, a substrate 30, and electronic components mounted on the substrate 30. The substrate 30 and the electronic components are covered with a cover 50. The heat sink 20 integrally includes a heat sink body 21 and a plurality of struts 22 extending from the heat sink body 21 toward the substrate 30. The heat sink 20 is formed of, for example, aluminum by casting or cutting, and absorbs heat generated by each electronic component to which current is being supplied. The heat sink 20 is electrically connected to a negative electrode of a battery of an undepicted vehicle.

Figure 5:
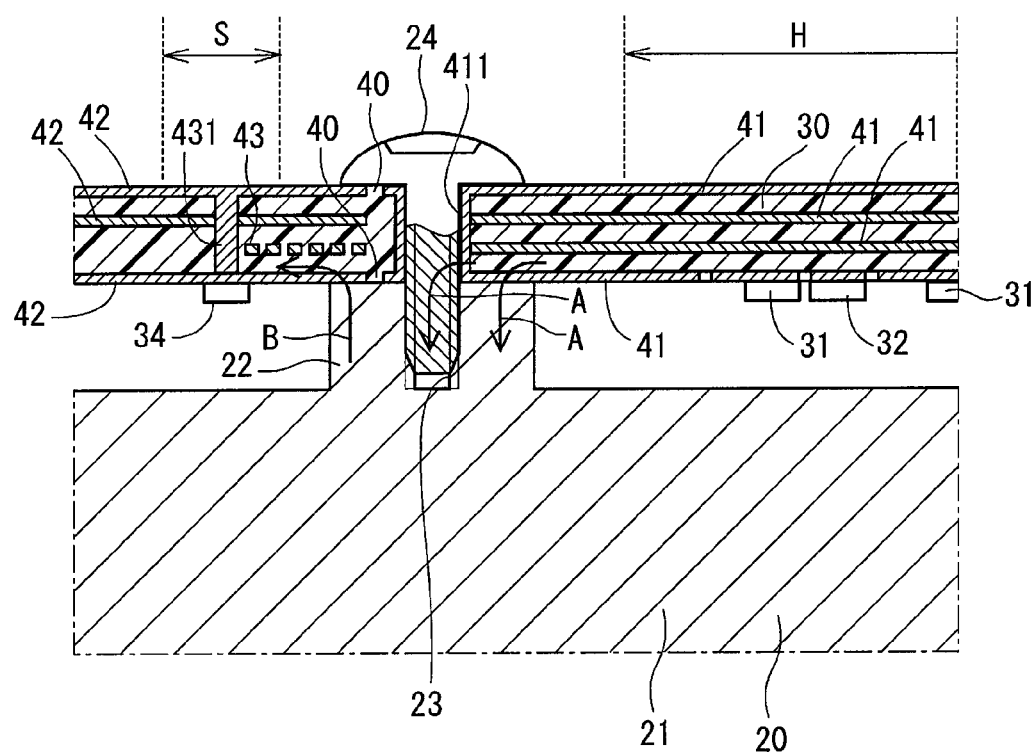
FIG. 5 is a sectional view along a line V-V of FIG. 3 or 4.

The substrate 30 is a multilayer substrate, and is fixed to the heat sink 20 by a plurality of screws 24 threadably engaged in tapped holes 23 provided in the respective struts 22 of the heat sink 20 (see FIG. 5). The electronic components including switching elements 31 such as MOSFETs, shunt resistances 32, a position sensor 33, a temperature sensor 34, and a microcomputer 35 are mounted on the substrate 30 on a side close to the heat sink 20. The substrate 30 is connected to a motor line 71 extending from the coil 7 of the motor part 3. Any of the electronic components such as the switching elements 31 and the shunt resistances 32, which generate heat due to current supply, corresponds to an example of "heating component". As illustrated in FIG. 2, in the first embodiment, a high-temperature region H, in which the switching elements 31 and the like are collectively disposed, is provided in a predetermined portion of the substrate 30.

The switching elements 31 mounted on the substrate 30 include a switching element configuring a three-phase inverter circuit for supplying power to the motor part 3, and a switching element serving as a switch that can shut off power supplied from a connector 36 to the three-phase inverter circuit. The shunt resistances 32 are used for measurement of a current flowing through the switching element 31 configuring the three-phase inverter circuit. The position sensor 33 detects a magnetic field of a magnet 12 provided at an end of the shaft 8 of the motor part 3 and thus detects a position of the rotor 5. The microcomputer 35 turns on or off each switching element 31 depending on the position of the rotor 5 detected by the position sensor 33 and on the amount of current necessary for the steering assist torque, and thus controls current supply from the inverter circuit to the coil 7. The temperature sensor 34 detects temperature of the substrate 30, and transmits such a temperature signal to the microcomputer 35. The microcomputer 35 controls the amount of supplied current such that temperature of each of the electronic components such as the switching elements 31 is within an allowable temperature range, based on the temperature detected by the temperature sensor 34 and a value of integral of the current supplied to the electronic component.

Figure 3:
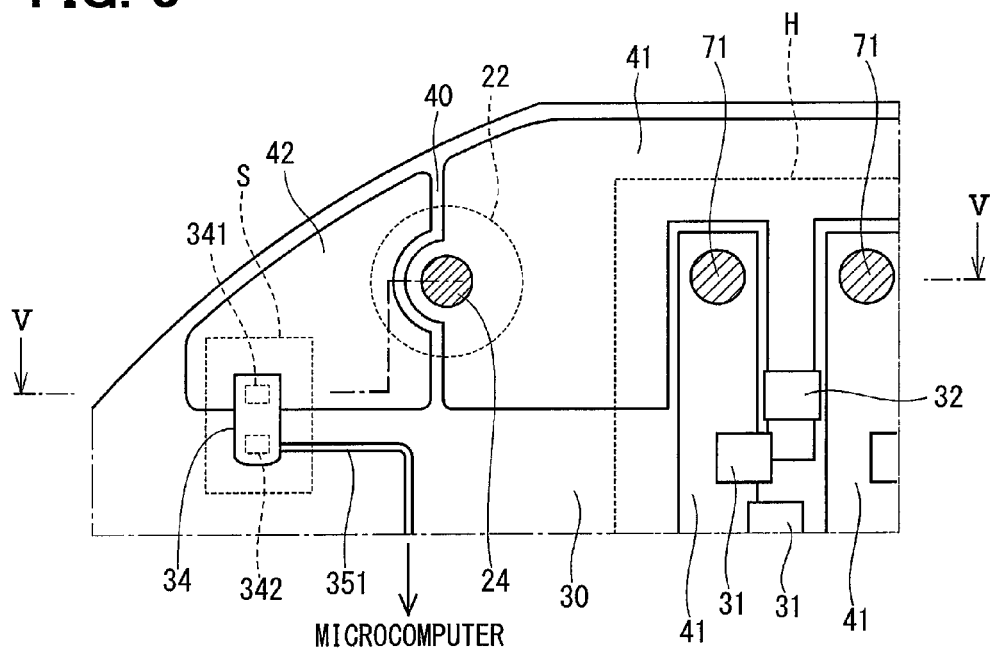
FIG. 3 is a schematic view of a surface-layer interconnection in a portion III of FIG. 2.
Figure 4:
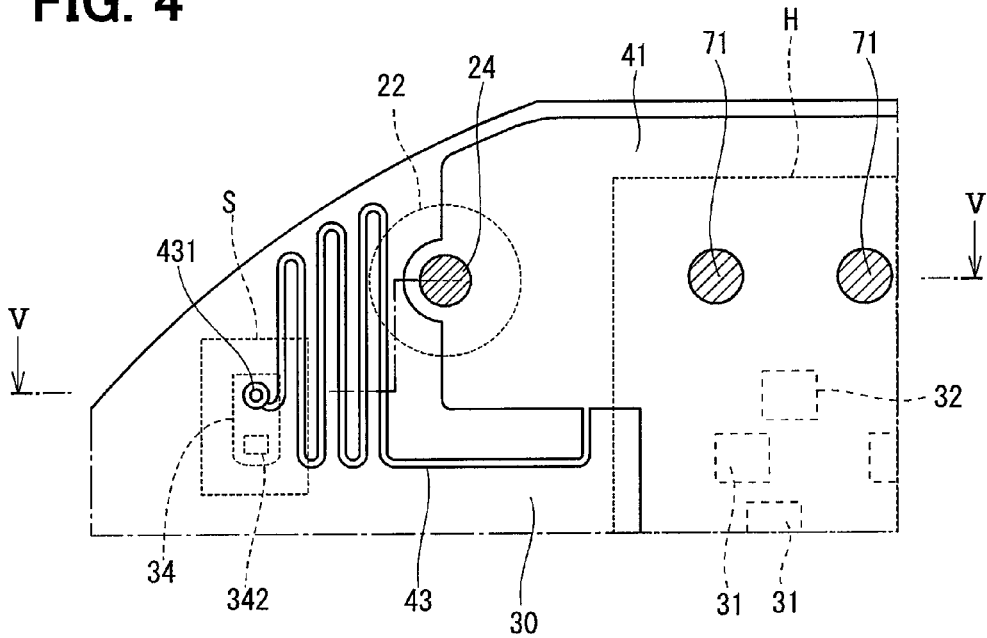
FIG. 4 is a schematic view of an inner-layer interconnection in the portion III of FIG. 2.

Distinctive Configuration of the electronic unit 1 will be described below. The distinctive configuration of the electronic unit 1 of the first embodiment is now described with reference to FIGS. 3 to 5. FIG. 3 schematically illustrates the outer layer of the substrate 30 in a portion III of FIG. 2. FIG. 4 schematically illustrates one of the inner layers of the substrate 30 in the portion III of FIG. 2. FIG. 5 schematically illustrates a section along a line V-V of FIG. 3 or 4. In FIGS. 3 and 4, a position of each strut 22 of the heat sink 20 is shown by a broken line.

As described above, the substrate 30 has the high-temperature region H in which the switching elements 31 and the like are collectively mounted. In the first embodiment, the interconnections provided in the high-temperature region H are generically called first interconnection 41. The first interconnection 41 is provided in each of the outer and inner layers of the multilayer substrate 30, and is electrically connected between the layers through a through-hole 411 and the like. The first interconnection 41 provided in the outer layer of the substrate 30 on a side close to the heat sink 20 is in contact with the struts 22 of the heat sink 20 and with the heads of the screws 24. Hence, the first interconnection 41 provided in each of the outer and inner layers of the substrate 30 is electrically connected to the heat sink 20. Heat generated by the switching elements 31 and the like is absorbed by the heat sink body 21 via the first interconnection 41 and the struts 22 of the heat sink 20 in this order. In such a case, the heat sink 20 has a sufficient heat capacity and thus shows a small variation in temperature, i.e., has stable temperature.

A second interconnection 42 is provided in a detection region S in which the temperature sensor 34 is mounted on the substrate 30. The temperature sensor 34 has one terminal 341 electrically connected to the second interconnection 42 and the other terminal 342 electrically connected to an interconnection 351 extending to the microcomputer 35. The second interconnection 42 is also provided in each of the outer and inner layers of the multilayer substrate 30, and is electrically connected between the layers through a through-hole 431 and the like. The second interconnection 42 provided in the outer layer of the substrate 30 on the side close to the heat sink 20 is in contact with a predetermined strut 22 of the heat sink 20 and with the head of the screw 24. The second interconnection 42 provided in each of the outer and inner layers of the substrate 30 is therefore electrically connected to the heat sink 20.

The first interconnection 41 and the second interconnection 42 are provided separately from each other in any layer of the substrate 30. Specifically, a slit 40 containing a resin configuring the substrate 30 is provided between the first interconnection 41 and the second interconnection 42 in any layer of the substrate 30. The slit 40 increases the heat resistance between the first interconnection 41 and the second interconnection 42, and consequently heat is less likely to be transferred from the first interconnection 41 in the high-temperature region H to the second interconnection 42. The second interconnection 42 is in contact with the predetermined strut 22 of the heat sink 20, and therefore shows a small variation in temperature, i.e., has stable temperature as with the heat sink 20. The first interconnection 41 and the second interconnection 42 are each connected to a predetermined strut 22 of the heat sink 20. Specifically, the first interconnection 41 and the second interconnection 42 are provided separately from each other across the slit 40 in the substrate 30, and are connected to each other via the heat sink 20.

As illustrated in FIGS. 4 and 5, a third interconnection 43 is provided in a predetermined inner layer of the substrate 30. The third interconnection 43 has one end connected to a terminal 341 of the temperature sensor 34 through the through-hole 431, and the other end connected to the first interconnection 41. The third interconnection 43 is provided meandering through the inner layer of the substrate 30. Consequently, even if the screw 24 fixing the substrate 30 to the heat sink 20 is loosened and thus the second interconnection 42 is electrically disconnected from the strut 22 of the heat sink 20, the third interconnection 43 maintains current supply to the temperature sensor 34. Since the third interconnection 43 meanders through the inner layer of the substrate 30, heat is transferred from the first interconnection 41 to the third interconnection 43 while being radiated to the resin configuring the substrate 30. A smaller quantity of heat is therefore transferred from the first interconnection 41 to the temperature sensor 34.

A transfer path of heat, which is generated by the switching elements 31 and the like mounted in the high-temperature region H, is now described with reference to FIG. 5. There is given R1>R2, where R1 is thermal resistance of the slit 40 provided between the first interconnection 41 and the second interconnection 42, and R2 is thermal resistance caused by contact between the strut 22, the screw 24, and the first interconnection 41. Hence, as shown by an arrow A in FIG. 5, heat in the high-temperature region H is absorbed by the heat sink body 21 via the first interconnection 41, the strut 22 of the heat sink 20, and the screw 24 in this order. As shown by an arrow B in FIG. 5, a variation in temperature of the heat sink 20 is transmitted to the temperature sensor 34 through the second interconnection 42. In contrast, a smaller quantity of heat is transferred from the first interconnection 41 to the second interconnection 42 via the slit 40. The heat sink 20 has a sufficient heat capacity and thus shows a small variation in temperature. Hence, the temperature sensor 34 detects temperature that is less varied, or stable.

Figure 6:
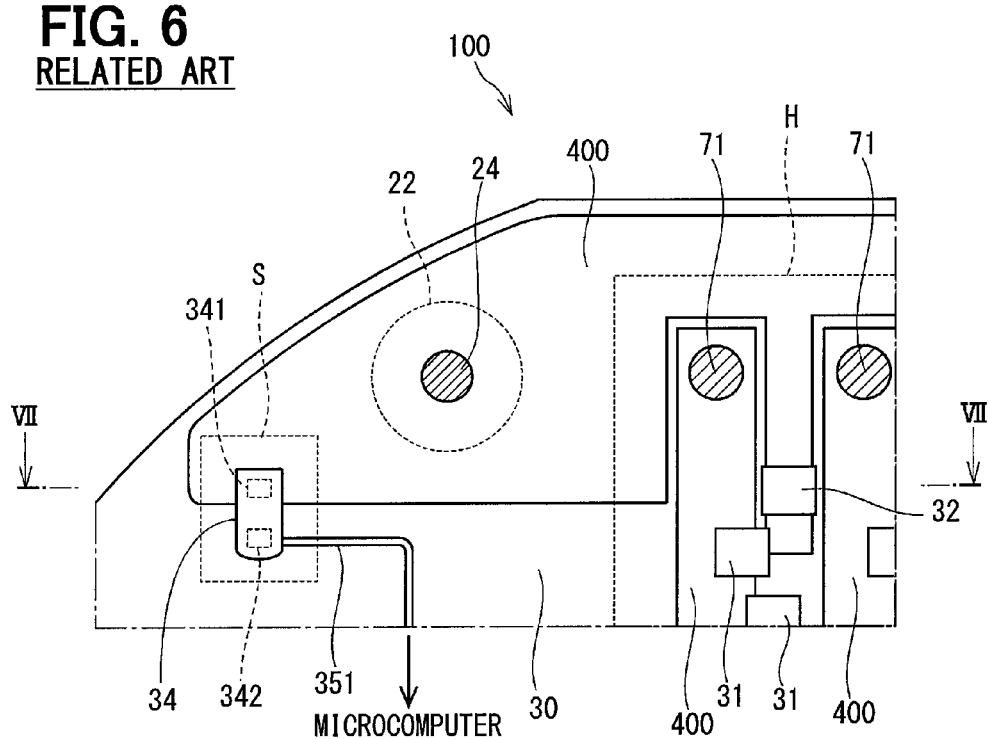
FIG. 6 is a schematic view of a surface-layer interconnection of an electronic unit of a comparative example.
Figure 7:
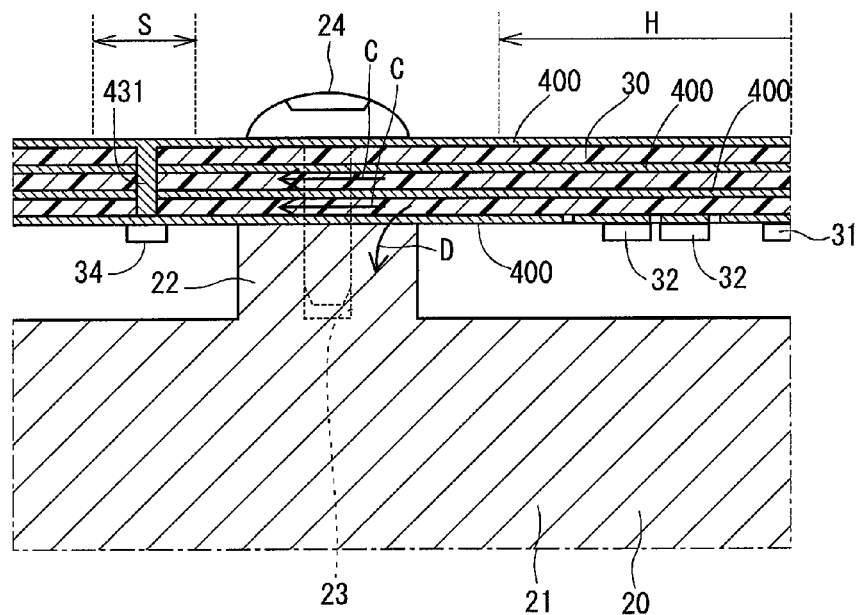
FIG. 7 is a sectional view along a line VII-VII of FIG. 6.

An electronic unit 100 of a comparative example is now described. As illustrated in FIGS. 6 and 7, in the comparative example, an interconnection 400 in the high-temperature region H is integrally provided with an interconnection 400 in the detection region S in which the temperature sensor 34 is mounted. In any layer of the multilayer substrate 30, the interconnection 400 in the high-temperature region H is continuous with the interconnection 400 in the detection region S.

For the electronic unit 100 of the comparative example, a transfer path of heat, which is generated by the switching elements 31 and the like mounted in the high-temperature region H, is now described with reference to FIG. 7. R3 is thermal resistance of the interconnection 400, and R2 is thermal resistance caused by contact between the strut 22, the screw 24, and the first interconnection 41. Since the two interconnections 400 are continuous with each other, thermal resistance is not caused by contact. In contrast, thermal resistance is caused by contact between the first interconnection 41, the strut 22, and the screw 24. As a result, R3<R2 is given. Hence, as shown by an arrow C in FIG. 7, heat in the high-temperature region H is directly transferred to the detection region S, in which the temperature sensor 34 is mounted, through the interconnections 400. The temperature sensor 34 detects temperature of the interconnection in the detection region S.

As shown by an arrow D in FIG. 7, part of heat transferred through the interconnection is absorbed by the heat sink body 21 via the struts 22 of the heat sink 20 and the screws 24. However, thermal resistance R2 of the contact surface between the interconnection and each strut 22 of the heat sink 20 is larger than thermal resistance R3 of the interconnection 400. Hence, in the comparative example, a large quantity of heat is directly transferred from the high-temperature region H to the temperature sensor 34 through the interconnection 400. This results in a large variation in temperature detected by the temperature sensor 34.

Figure 8A:
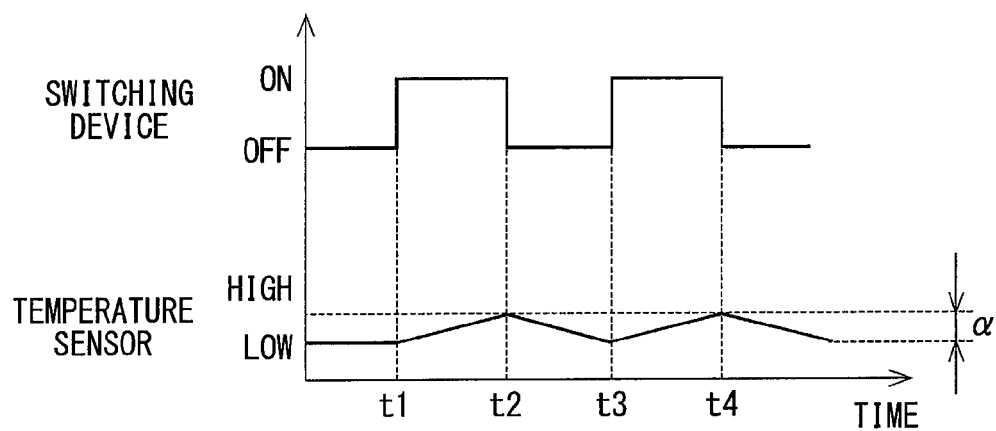
FIG. 8A is a graph illustrating a temperature detected by a temperature sensor of the first embodiment.
Figure 8B:
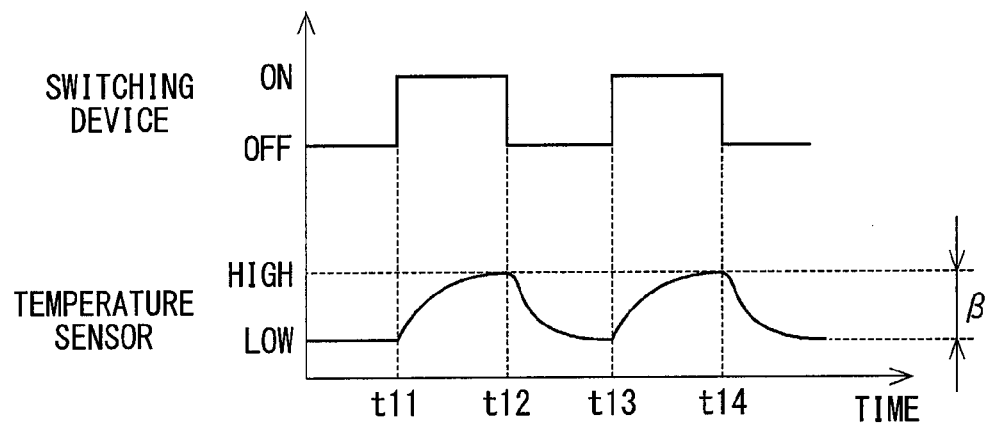
FIG. 8B is a graph illustrating a temperature detected by a temperature sensor of the comparative example.

The temperature detected by the temperature sensor 34 is now described for each of the first embodiment and the comparative example. FIG. 8A illustrates a relationship between ON/OFF of current supply to the switching element 31 of the electronic unit 1 of the first embodiment and temperature detected by the temperature sensor 34. FIG. 8B illustrates a relationship between ON/OFF of current supply to the switching element 31 of the electronic unit 1 of the comparative example and temperature detected by the temperature sensor 34. As illustrated in FIG. 8A, in the electronic unit 1 of the first embodiment, current supply to the switching element 31 is ON between time t1 and time t2, OFF between time t2 and time t3, ON between time t3 and time t4, and OFF after time t4. In addition, temperature detected by the temperature sensor 34 gradually increases between time t1 and time t2, gradually decreases between time t2 and time t3, gradually increases between time t3 and time t4, and gradually decreases after time t4. A difference in height of the temperature detected by the temperature sensor 34 of the first embodiment is designated by α.

As illustrated in FIG. 8B, in the electronic unit 100 of the comparative example, current supply to the switching element 31 is ON between time t11 and time t12, OFF between time t12 and time t13, ON between time t13 and time t14, and OFF after time t14. In addition, temperature detected by the temperature sensor 34 drastically increases between time t11 and time t12, drastically decreases between time t12 and time t13, drastically increases between time t13 and time t14, and drastically decreases after time t4. A difference in height of the temperature detected by the temperature sensor 34 of the comparative example is designated by β. As illustrated in FIGS. 8A and 8B, the difference in height α of the temperature detected by the temperature sensor 34 of the first embodiment is smaller than the difference in height β of the temperature detected by the temperature sensor 34. Consequently, the temperature sensor 34 of the first embodiment is little affected by variations in temperature of the high-temperature region H and can stably detect temperature compared with the temperature sensor 34 of the comparative example.

The electronic unit 1 of the first embodiment exhibits the following functions and effects. (1) In the first embodiment, the first interconnection 41 is provided in the high-temperature region H of the substrate 30 while being connected to the strut 22 of the heat sink 20. The second interconnection 42 is provided in the detection region S of the substrate 30 separately from the first interconnection 41 while being connected to the strut 22 of the heat sink 20 and to the temperature sensor 34. Consequently, the switching elements 31 and the like generate heat due to current supply, and the heat is radiated to the heat sink 20 via the first interconnection 41, and thus a smaller quantity of heat is directly transferred from the first interconnection 41 to the second interconnection 42. The heat sink 20 has a sufficient heat capacity and thus shows a small variation in temperature. Hence, the second interconnection 42 connected to the heat sink 20 shows a small variation in temperature, or has stable temperature. The electronic unit 1 therefore can detect stable temperature by the temperature sensor 34. As a result, the microcomputer 35 of the electronic unit 1 can control current supply such that temperature of each electronic component mounted on the substrate 30 is within an allowable temperature range.

The electronic unit 1 of the first embodiment does not have a notch groove around the temperature sensor unlike the electronic unit of JP2007-263636A as described in the prior art document. Hence, the electronic unit 1 of the first embodiment is not reduced in stiffness of the substrate and is not increased in size of the substrate unlike the electronic unit of PTL 1. The electronic unit 1 of the first embodiment therefore allows the substrate 30 to be reduced in size while maintaining stiffness of the substrate 30.

(2) In the first embodiment, the first interconnection 41 in the high-temperature region H of the substrate 30 and the second interconnection 42 in the detection region S of the substrate 30 are separated from each other in each of the surface layer and the inner layer of the substrate 30. This makes it possible to decrease the quantity of heat directly transferred from the first interconnection 41 to the second interconnection 42.

(3) In the first embodiment, the first interconnection 41 is electrically connected to the second interconnection 42 via the strut 22 of the heat sink 20. This makes it possible to maintain conduction between each electronic component such as the switching element 31 and the heat sink 20, and between the temperature sensor 34 and the heat sink 20.

(4) In the first embodiment, the slit 40 is provided between the first interconnection 41 and the second interconnection 42 at a position corresponding to the strut 22 of the heat sink 20. This makes it possible to maintain conduction between the first interconnection 41 and the heat sink 20, and conduction between the second interconnection 42 and the heat sink 20.

(5) In the first embodiment, the screw 24 fixing the strut 22 of the heat sink 20 to the substrate 30 is provided in the place in which the strut 22 of the heat sink 20 is connected to the first interconnection 41 and connected to the second interconnection 42. This makes it possible to electrically and mechanically connect between the first interconnection 41, the heat sink 20, and the second interconnection 42.

(6) In the first embodiment, the third interconnection 43 is provided meandering through the inner layer of the substrate 30, and electrically connects the terminal 341 of the temperature sensor 34 to the first interconnection 41. Consequently, the terminal 341 of the temperature sensor 34 is electrically connected to the strut 22 of the heat sink 20 in a place, which is different from the place for the strut 22 at which the slit 40 is located, via the third interconnection 43 and the first interconnection 41 in this order. Hence, even if the screw 24 fixing the substrate 30 to the heat sink 20 is loosened and thus the second interconnection 42 is electrically disconnected from the heat sink 20, conduction between the heat sink 20 and the temperature sensor 34 is maintained, allowing temperature detection by the temperature sensor 34. Since the third interconnection 43 is provided meandering through the inner layer of the substrate 30, heat is transferred through the third interconnection 43 while being radiated to the resin configuring the substrate 30. It is therefore possible to decrease the quantity of heat transferred from the first interconnection 41 to the temperature sensor 34.

(7) In the first embodiment, the first interconnection 41 is connected to the strut 22 for connection of the heat sink 20 to the second interconnection 42, and is also connected to a strut 22 in a place different from the place for that strut 22. Consequently, even if the screw 24 fixing the substrate 30 to the strut 22 of the heat sink 20 is loosened and thus the second interconnection 42 is electrically disconnected from the heat sink 20, the second interconnection 42 can still be electrically connected to the heat sink 20 through the strut 22 in the different place via the third interconnection 43 and the first interconnection 41.

Second Embodiment

Figure 9:
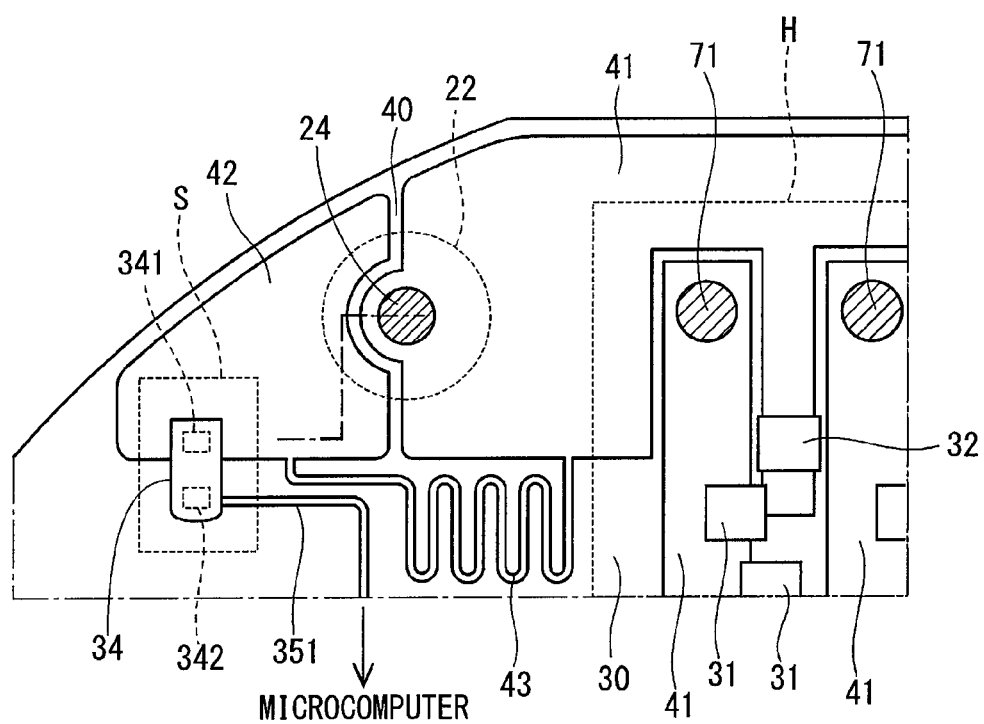
FIG. 9 is a schematic view of a surface-layer interconnection of a substrate of an electronic unit according to a second embodiment.

A second embodiment is shown in FIG. 9. In the second embodiment, the third interconnection 43 is provided in a surface layer of the substrate 30. The third interconnection 43 has one end connected to the second interconnection 42 and the other end connected to the first interconnection 41. The third interconnection 43 is provided meandering through the surface layer of the substrate 30. When the third interconnection 43 is provided in the surface layer of the substrate 30, the third interconnection 43 may be disposed separately from a region in which the strut 22 of the heat sink 20 comes into contact with the surface layer of the substrate 30. Furthermore, the third interconnection 43 may be disposed separately from a region in which the head of the screw 24 comes into contact with the surface layer of the substrate 30. This restrains the third interconnection 43 from being broken due to axial force of the screw 24.

In the second embodiment, even if the screw 24 fixing the substrate 30 to the heat sink 20 is loosened and thus the second interconnection 42 is electrically disconnected from the strut 22 of the heat sink 20, the third interconnection 43 also maintains current supply to the temperature sensor 34. Since the third interconnection 43 meanders through the surface layer of the substrate 30, heat is transferred from the first interconnection 41 to the third interconnection 43 while being radiated to the resin configuring the substrate 30. It is therefore possible to decrease the quantity of heat transferred from the first interconnection 41 to the temperature sensor 34.

Modifications of the above embodiments will be described below. The above-described embodiments have been described on the electronic unit 1 used in the driving gear 2 of the electromotive power steering system. In another embodiment, the electronic unit 1 may be used for controlling any of various devices without being limited to the driving gear 2 of the electromotive power steering system.

The above-described embodiments have been described on the electronic unit 1 configured integrally with the motor part 3. In another embodiment, the electronic unit 1 may be configured as a unit separated from the motor part 3, or may control any of various devices other than a motor.

The above-described embodiments have been described with the switching elements 31 and the shunt resistances 32 as exemplary heating components that generate heat due to current supply. In another embodiment, various electronic components that generate heat due to current supply, such as a chalk coil, a capacitor, and a relay, correspond to the heating components.

The above-described embodiments have been described with the four-layered multilayer substrate 30 as an example. In another embodiment, the substrate may be a single-layer substrate or a multilayer substrate other than the four-layered multilayer substrate. As described above, the present disclosure is not limited to the above-described embodiments, and may include various combinations of such embodiments, and can be carried out in various modes within the scope without departing from the gist of the disclosure.

Characteristics of the electronic unit 1 of the above embodiments can be described as follows.

An electronic unit 1 includes a heat sink 20, a substrate 30, a heating component 31, 32, a temperature sensor 34, a first interconnection 41, and a second interconnection 42. The substrate 30 is fixed to a strut 22 of the heat sink 20. The heating component 31, 32 that generates heat upon energization of the heating component 31, 32 is provided in a high-temperature region H of the substrate 30. The temperature sensor 34 that detects temperature is mounted in a detection region S of the substrate 30. The first interconnection 41 is provided in the high-temperature region H of the substrate 30 and is connected to the strut 22 of the heat sink 20. The second interconnection 42 is provided in the detection region S of the substrate 30 separately from the first interconnection 41. The second interconnection 42 is connected to the strut 22 of the heat sink 20 and the temperature sensor 34. Consequently, heat of the first interconnection 41 is absorbed by the heat sink 20, and thus a smaller quantity of heat is directly transferred from the first interconnection 41 to the second interconnection 42. The second interconnection 42 connected to the heat sink 20 has stable temperature as with the heat sink 20. Hence, the electronic unit 1 can stably detect temperature by the temperature sensor 34 connected to the second interconnection 42.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic unit, comprising:
a heat sink that includes a strut;
a substrate that is fixed to the strut of the heat sink;
a heating component that is mounted on the substrate to generate heat upon energization of the heating component;
a temperature sensor that is mounted on the substrate to detect temperature;
a first interconnection that is provided in a high-temperature region in which the heating component is mounted on the substrate and that is connected to the strut of the heat sink; and
a second interconnection that is provided in a detection region in which the temperature sensor is mounted on the substrate and that is provided separately from the first interconnection, wherein the second interconnection is connected to the strut of the heat sink and the temperature sensor.

2. The electronic unit according to claim 1, further comprising a slit that is formed between the first interconnection and the second interconnection wherein:
resin, from which the substrate is formed, is provided in between the slit; and
the slit is provided at a position corresponding to the strut of the heat sink.

3. The electronic unit according to claim 1, wherein:
the substrate is a multilayer substrate; and
the first interconnection and the second interconnection are separated from each other on a surface layer of the substrate and in an inner layer of the substrate.

4. The electronic unit according to claim 1, wherein:
the first interconnection is electrically connected to the heating component;
the second interconnection is electrically connected to the temperature sensor; and
the first interconnection and the second interconnection are electrically connected to each other via the strut of the heat sink.

5. The electronic unit according to claim 1, further comprising a screw for fixing together the strut of the heat sink and the substrate.

6. The electronic unit according to claim 1, further comprising a third interconnection that is provided in a meandering manner on a surface layer of the substrate or through an inner layer of the substrate, wherein the third interconnection electrically connects together a terminal of the temperature sensor and the first interconnection.

7. The electronic unit according to claim 1, wherein:
the strut is one of a plurality of struts;
the second interconnection is connected to a first one of the plurality of struts; and
the first interconnection is connected to the first one of the plurality of struts as well as to a second one of the plurality of struts which is located at a different position from the first one of the plurality of struts.

* * * * *